(12) United States Patent
Kim

(10) Patent No.: US 7,439,161 B2
(45) Date of Patent: Oct. 21, 2008

(54) SEMICONDUCTOR DEVICE AND METHOD FOR MANUFACTURING THE SAME

(75) Inventor: Seok Su Kim, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 63 days.

(21) Appl. No.: 11/484,770

(22) Filed: Jul. 12, 2006

(65) Prior Publication Data

US 2007/0013034 A1    Jan. 18, 2007

(30) Foreign Application Priority Data

Jul. 12, 2005    (KR)    ...................... 10-2005-0062663

(51) Int. Cl.
*H01L 21/46* (2006.01)
(52) U.S. Cl. ........................ 438/462; 438/113; 438/458; 257/620
(58) Field of Classification Search .................. 438/113, 438/458, 462; 257/620
See application file for complete search history.

(56) References Cited

U.S. PATENT DOCUMENTS

| | | | | |
|---|---|---|---|---|
| 5,342,495 A | * | 8/1994 | Tung et al. | 204/297.03 |
| 5,902,717 A | * | 5/1999 | Hayakawa | 430/313 |
| 6,153,941 A | * | 11/2000 | Maejima | 257/797 |
| 2002/0000642 A1 | * | 1/2002 | Lin et al. | 257/620 |
| 2004/0147097 A1 | * | 7/2004 | Pozder et al. | 438/584 |

FOREIGN PATENT DOCUMENTS

| | | | | |
|---|---|---|---|---|
| JP | 2001057367 A | * | 2/2001 |
| JP | 2001291715 A | * | 10/2001 |

* cited by examiner

*Primary Examiner*—Andy Huynh
(74) *Attorney, Agent, or Firm*—Finnegan, Henderson, Farabow, Garrett, & Dunner, L.L.P.

(57) ABSTRACT

A method for manufacturing a semiconductor device includes forming a first insulating layer on a semiconductor substrate having a semiconductor chip region and a scribe region; forming a mask pattern on the first insulating layer; removing portions of the first insulating layer using the mask pattern so as to form a contact hole in the semiconductor chip region and a scribe region opening exposing the scribe region; forming a metal contact plug in a contact hole and a metal sidewall on a side of the first insulating layer in the scribe region opening; forming a metallization wiring on the first insulating layer; and forming a second insulating layer and a protective layer over the metal contact plug and the metal sidewall so as to cover the semiconductor chip region and the scribe region.

9 Claims, 6 Drawing Sheets

SEMICONDUCTOR CHIP REGION | SCRIBE REGION

SEMICONDUCTOR DEVICE AND METHOD FOR MANUFACTURING THE SAME

RELATED APPLICATION

This application is based upon and claims the benefit of priority to prior Korean Application No. 10-2005-0062663, filed on Jul. 12, 2005, the entire contents of which are incorporated by reference herein.

BACKGROUND

1. Technical Field

The present invention relates to a semiconductor device and a method for manufacturing the same.

2. Description of the Related Art

A semiconductor wafer having a plurality of integrated circuits formed by a series of manufacturing processes is cut into individual semiconductor chips. In general, a wafer sawing equipment is used in cutting a semiconductor wafer.

A sawing blade is generally used as a wafer sawing equipment. A laser beam can be also used. A semiconductor wafer is divided into unit chips using the sawing blade.

Sawing process using a blade can be also applied in division of a substrate strip, on which a semiconductor chip is mounted, into unit semiconductor chip packages. Hereinafter, a conventional method for manufacturing a semiconductor device will be described referring to the following drawings.

FIGS. 1A to 1E are cross-sectional views illustrating a conventional method for manufacturing a semiconductor device.

As shown in FIG. 1A, a first insulating layer 11 is formed on a semiconductor substrate (not shown) having a semiconductor chip region and a scribe region.

Then, portions of the first insulating layer 11 is selectively removed to expose a surface of the semiconductor substrate, using photolithography and etching processes, thus forming a contact hole 12.

Referring to FIG. 1B, a metal layer for a contact plug is deposited over an entire surface of the semiconductor substrate, filling the contact hole 12. The substrate then undergoes a chemical mechanical polishing (CMP) process, thus forming a metal contact plug 13 within the contact hole 12.

Next, as shown in FIG. 1C, another metal layer for a metallization wiring is deposited over the entire surface of the substrate, and is selectively removed by photolithography and etching processes, thus forming the metallization wiring 14 electrically connected with a predetermined circuit element on the substrate via the metal contact plug 13.

As shown in FIG. 1D, a second insulating layer 15 is formed over the entire surface of the substrate including the metallization wiring 14, and then a protective layer 16 is formed on the second insulating layer 15.

After forming the protective layer 16, the substrate is divided into unit chips by a sawing process at the scribe region. FIG. 1E shows the side surface "A," which is exposed to the atmosphere by the sawing process.

The above-described conventional method for manufacturing a semiconductor device has a number of problems. Particularly, even though the top surface of the divided unit chip is protected by the protective layer 16, the side surfaces of the second insulating layer 15 and the first insulating layer 11 are exposed to the atmosphere by the sawing process. Accordingly, oxygen or nitrogen in the atmosphere may penetrate into the semiconductor chip through the exposed surfaces of the second insulating layer 15 and the first insulating layer 11, thus resulting in deterioration of the semiconductor chip.

SUMMARY

Embodiments consistent with the present invention provide a semiconductor device, wherein penetration of impurities such as oxygen or nitrogen in the atmosphere into the semiconductor chip can be prevented, and a method for manufacturing the same. The present invention improves the characteristics and reliability of the semiconductor chip.

A semiconductor device consistent with the present invention includes a semiconductor substrate having a semiconductor chip region and a scribe region; a first insulating layer formed in the semiconductor chip region of the semiconductor substrate; a metal contact plug formed in the first insulating layer; a metal sidewall formed on a side of the first insulating layer in the scribe region; a metallization wiring electrically connected with the substrate via the metal contact plug; and a second insulating layer and a protective layer formed over the metal contact plug and the metal sidewall so as to cover the semiconductor chip region and the scribe region.

A method for manufacturing a semiconductor device consistent with the present invention includes forming a first insulating layer on a semiconductor substrate having a semiconductor chip region and a scribe region; forming a mask pattern on the first insulating layer, the mask pattern including a first opening exposing a contact area in the semiconductor chip region and a second opening exposing the scribe region; removing portions of the first insulating layer using the mask pattern so as to form a contact hole in the semiconductor chip region and a scribe region opening exposing the scribe region; forming a metal contact plug in the contact hole and a metal sidewall on a side of the first insulating layer in the scribe region opening; forming a metallization wiring on the first insulating layer, the metallization layer electrically connected with the metal contact plug; and forming a second insulating layer and a protective layer over the metal contact plug and the metal side wall so as to cover the semiconductor chip region and the scribe region.

These and other aspects of the invention will become evident by reference to the following description of the invention, often referring to the accompanying drawings.

DETAILED DESCRIPTION

FIGS. 2A to 2F are cross-sectional views illustrating a method for manufacturing a semiconductor device consistent with the present invention.

Figure 1A:
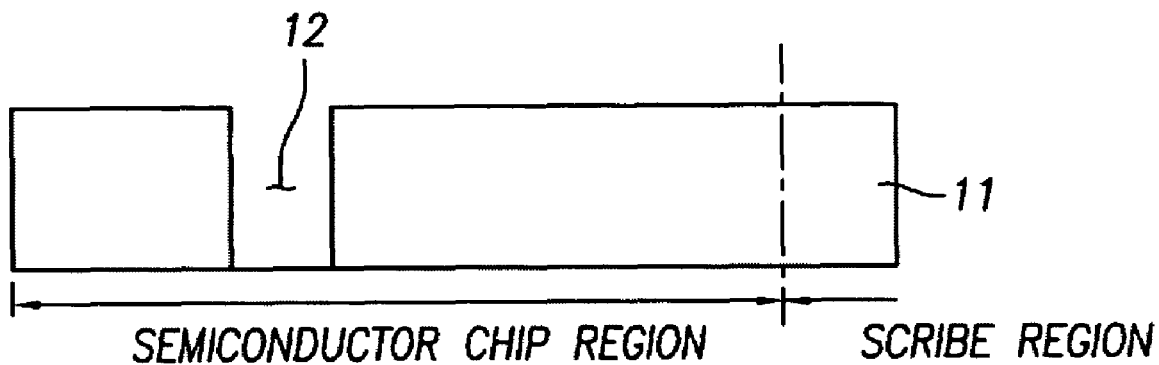
FIGS. 1A to 1E are cross-sectional views illustrating a conventional method for manufacturing a semiconductor device.
Figure 1B:
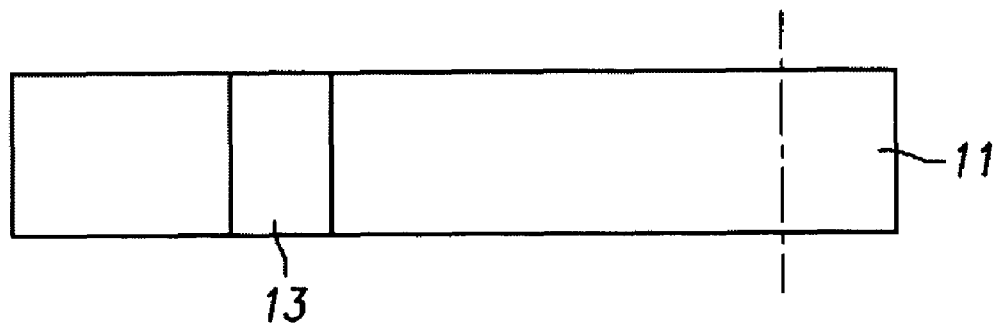
Figure 1C:
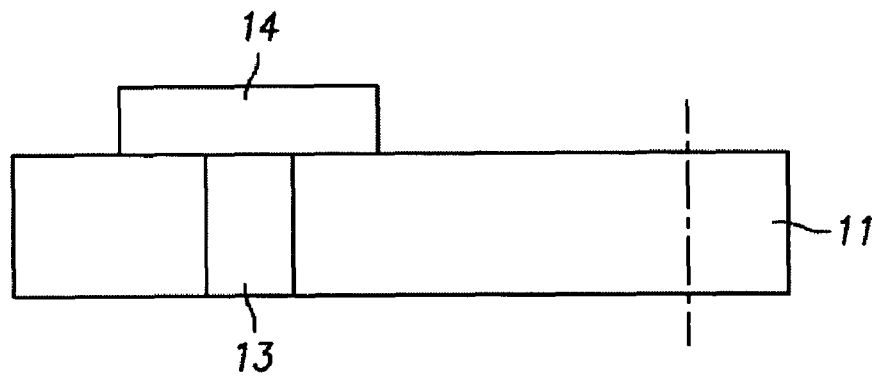
Figure 1D:
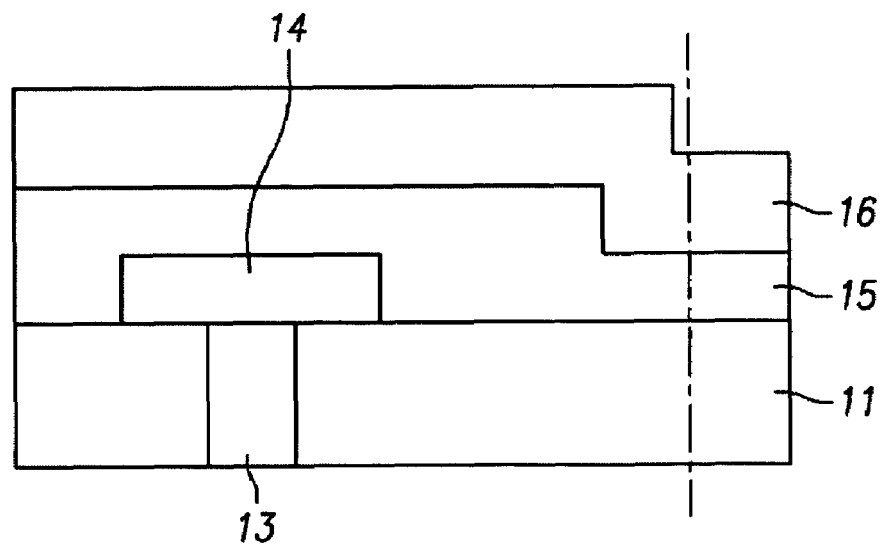
Figure 1E:
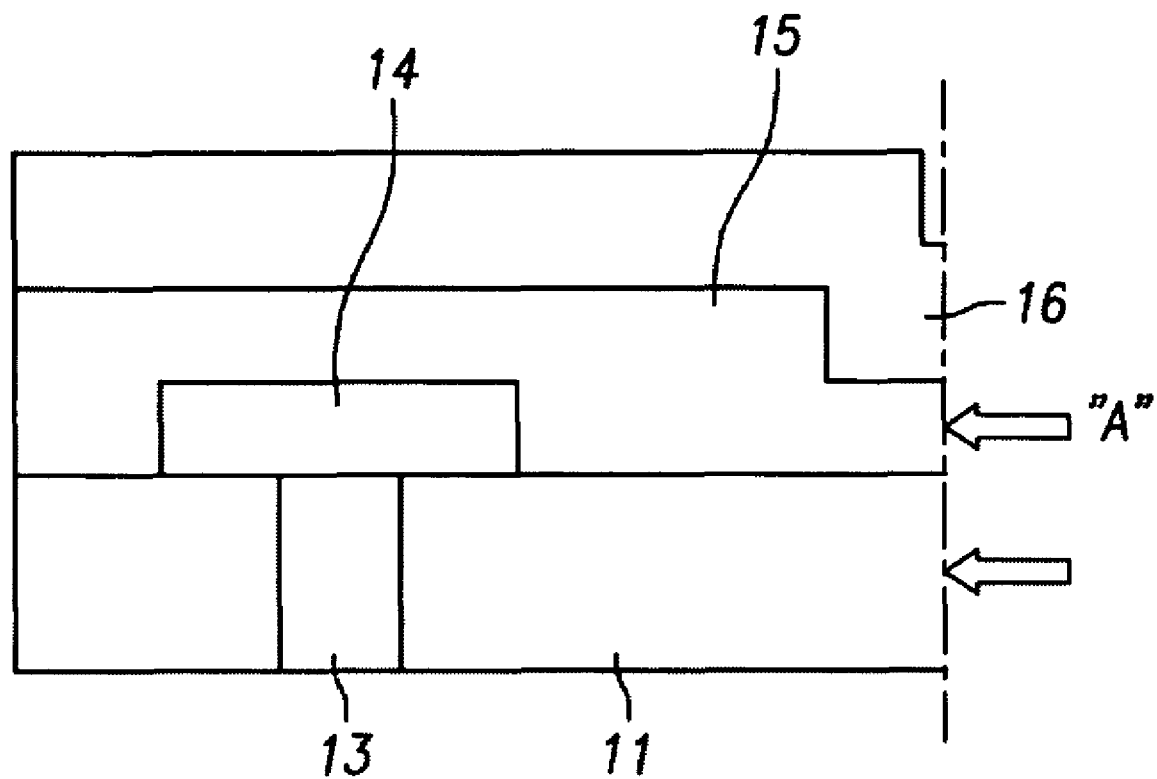
Figure 2A:
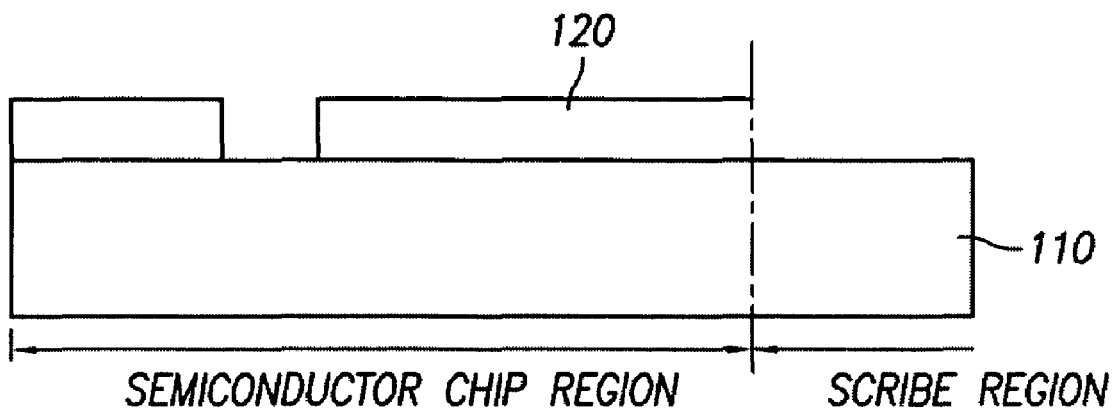
FIGS. 2A to 2F are cross-sectional views illustrating a method for manufacturing a semiconductor device consistent with the present invention.

As shown in FIG. 2A, a first insulating layer 110 is formed on a semiconductor substrate (not shown)having a semiconductor chip region and a scribe region.

Next, a mask pattern 120 is formed on the first insulating layer 110, exposing portions of the first insulating layer 110 in the semiconductor chip region and the scribe region. The mask pattern 120 may be formed using a metal contact mask or a photoresist material.

Figure 2B:
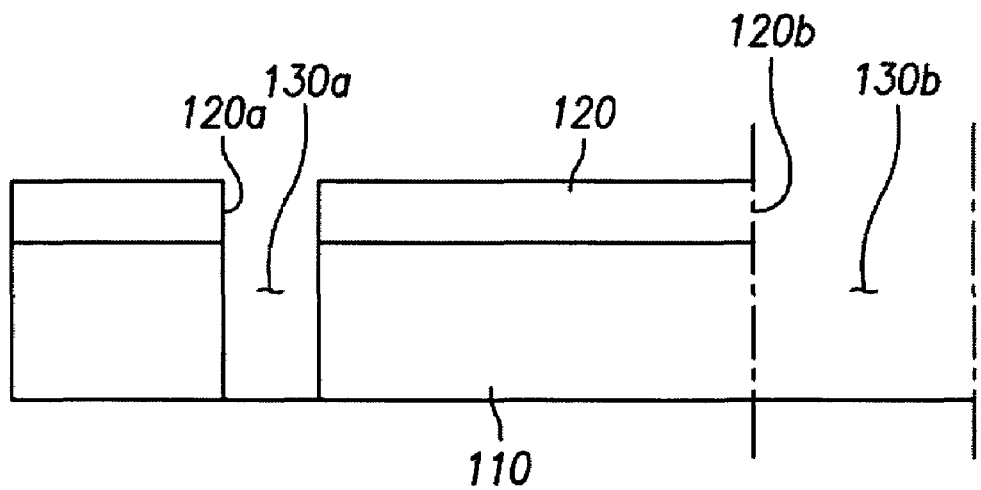

FIG. 2B shows that the first insulating layer 110 in semiconductor chip region is exposed through an opening 120a in the mask pattern 120, and that the first insulating layer 110 in the scribe region is exposed through an opening 120b in the mask pattern 120. Then, the exposed portions of the first insulating layer 110 are removed by an etching process using the mask pattern 120. As a result, a contact hole 130a is formed underneath the opening 120a in the first insulating layer 110, and a scribe region opening 130b exposing the scribe region is formed underneath the opening 120b.

Figure 2C:
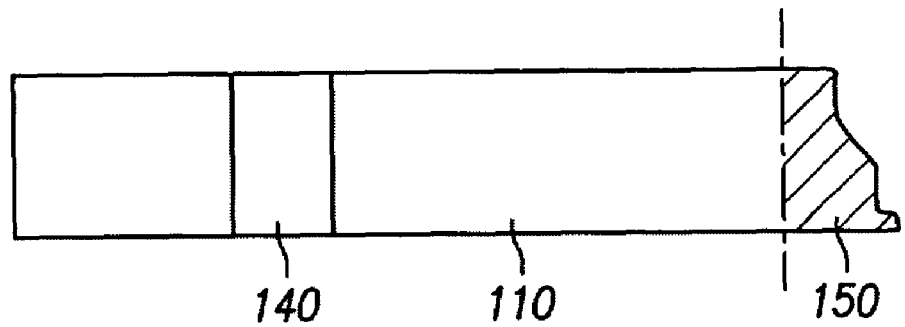

Subsequently, as shown in FIG. 2C, the mask pattern 120 is removed, and a metal layer for a contact plug is deposited over the entire surface of the substrate, filling in the contact hole 130a and the scribe region opening 130b. Here, the metal layer may comprise tungsten, copper, and other suitable metal material may have a thickness such that the metal layer completely fills the contact hole 130a.

Afterward, the substrate including the metal layer undergoes a CMP process or an etch back process, thus forming the metal contact plug 140 in the contact hole 130a and the metal sidewall 150 on one side of the first insulating layer 110 in the scribe region opening 130b.

The CMP process may be performed until the contact plug 140 is completely formed in the contact hole 130a. During such process, the metal material filled in the opening 130b may be significantly removed due to a dishing phenomenon, thus forming the metal sidewall 150 in the vicinity of the boundary of the first insulating layer 110. In addition, when the etch back process for the metal layer is performed to expose the first insulating layer 110, the metal layer filled in the opening 130b can be removed significantly, thus resulting in the metal sidewall 150 in the form of a spacer at the side of the first insulating layer 110. When the metal material considerably remains in the opening 130b after the CMP or etch back process, the semiconductor chip region where the contact plug 140 is formed is blocked using an additional mask, and then an additional etch back process can be performed to form the metal sidewall 150 in the scribe region where the opening 130b exists.

Figure 2D:
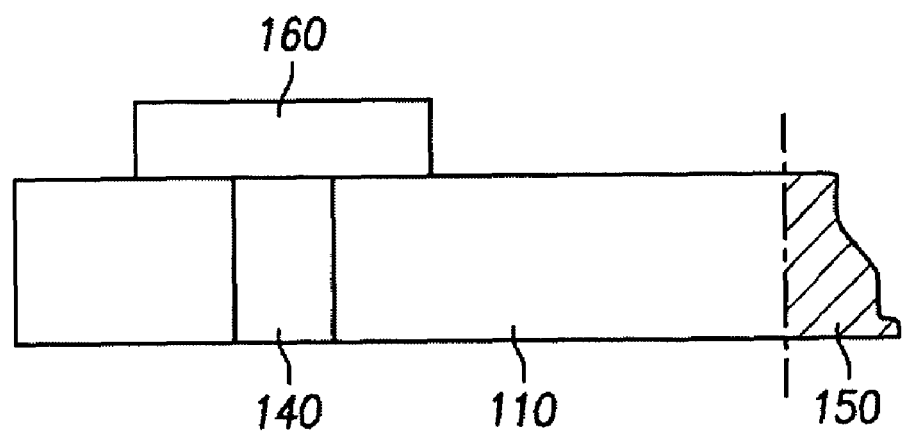

Subsequently, as shown in FIG. 2D, another metal layer is deposited over the entire surface of the semiconductor substrate including the metal contact plug 140, and is selectively removed by photolithography and etching processes, thus forming the metallization wiring 160 electrically connected with the substrate via the metal contact plug 140. Here, the metallization wiring 160 may comprise copper or tungsten.

Alternatively, the contact plug 140 and the metallization wiring 160 may be simultaneously formed using a copper damascene process. The damascene process generally involves forming a damascene structure including a via-hole and a trench in an insulating layer, and then filling the damascene structure with a copper material to simultaneously form a contact plug and a metallization wiring. When the damascene technique is used, the opening 130b exposing the scribe region can be formed along with the damascene structure. In addition, the damascene process includes a planarization step using a CMP technique after filling the damascene structure with copper. Accordingly, a dishing phenomenon can also occur so that the copper material filled in the opening 130b is considerably removed. Thus, the metal sidewall 150 can be formed during the CMP process. Moreover, in case of the damascene process, a barrier metal layer is preferably deposited on the damascene structure before filling the trench and via with copper.

Figure 2E:
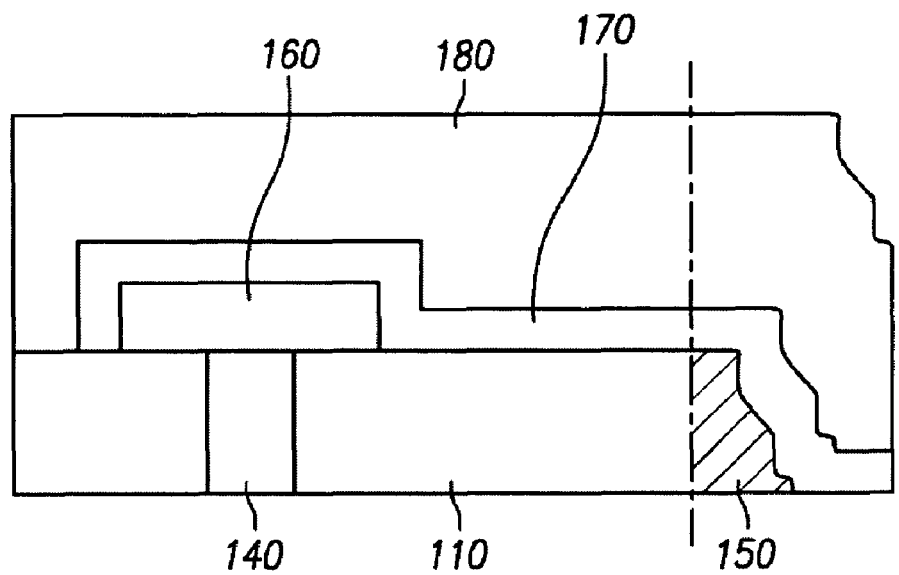
Figure 2F:
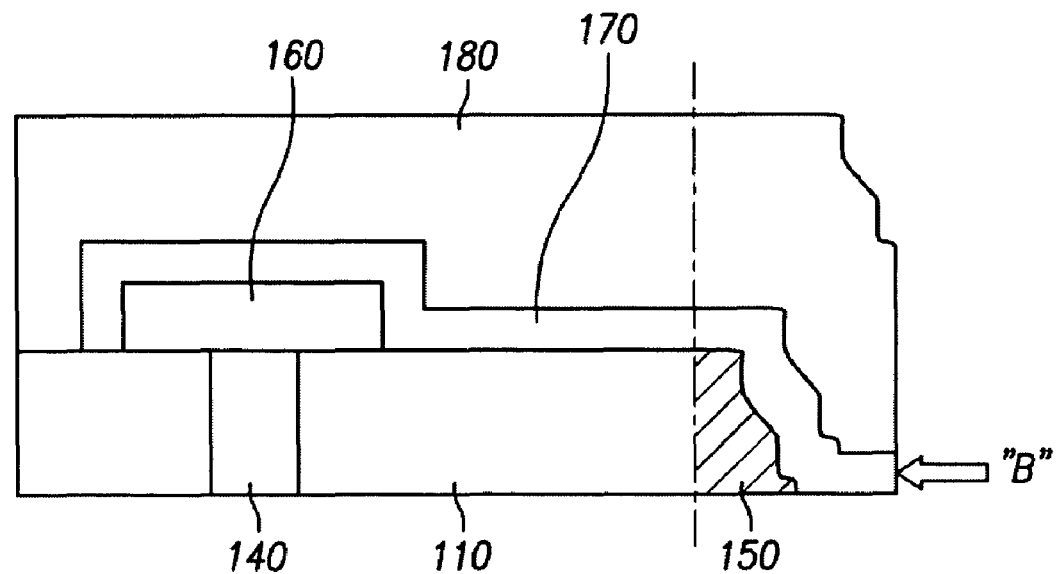

Next, as shown in FIG. 2E, a second insulating layer 170 is formed over the entire surface of the semiconductor device including the metallization wiring 160, and a protective layer 180 is formed on the second insulating layer 170. After forming the protective layer 180, the substrate is sawed in the scribe region, thus forming the semiconductor chip having the structure as shown in FIG. 2F. Referring to FIG. 2F, the number of interfaces exposed in the atmosphere due to the sawing process is considerably reduced. Namely, the exposed surface (referred to as "B") includes fewer interfaces between the layers of material in the semiconductor device and the atmosphere. Accordingly, penetration of impurities such as oxygen or nitrogen in the atmosphere into the layers of material in the semiconductor device is prevented, and characteristics and reliability of the semiconductor chip are improved.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for manufacturing a semiconductor device, comprising:
   forming a first insulating layer on a semiconductor substrate having a semiconductor chip region and a scribe region;
   forming a mask pattern on the first insulating layer, the mask pattern including a first opening exposing a contact area in the semiconductor chip region and a second opening exposing the scribe region;
   removing portions of the first insulating layer using the mask pattern so as to form a contact hole in the semiconductor chip region and a scribe region opening exposing the scribe region;
   forming a metal contact plug in the contact hole and a metal sidewall on a side of the first insulating layer in the scribe region opening;
   forming a metallization wiring on the first insulating layer, the metallization layer electrically connected with the metal contact plug; and
   forming a second insulating layer and a protective layer over the metal contact plug and the metal side wall so as to cover the semiconductor chip region and the scribe region.

2. The method of claim 1, wherein the mask pattern is a metal contact mask.

3. The method of claim 1, wherein the metal contact plug is formed using a CMP or an etch back process after depositing a metal layer.

4. The method of claim 3, wherein the metal layer comprises tungsten.

5. The method of claim 3, wherein the metal sidewall is formed by a dishing phenomenon of the metal layer filled in the scribe region opening during the CMP process.

6. The method of claim 3, wherein the metal sidewall is formed by etching of the metal layer filled in the scribe region opening during the etch back process.

7. The method of claim 1, wherein the contact hole is formed in a damascene structure.

8. The method of claim 1, wherein the metallization wiring comprises copper.

9. The method of claim 1, wherein the metal sidewall has a spacer form.

* * * * *